(12) United States Patent
Hegde et al.

(10) Patent No.: US 10,510,665 B2
(45) Date of Patent: Dec. 17, 2019

(54) LOW-K DIELECTRIC PORE SEALANT AND METAL-DIFFUSION BARRIER FORMED BY DOPING AND METHOD FOR FORMING THE SAME

(71) Applicant: Samsung Electronics Co., Ltd., Suwon-si, Gyeonggi-do (KR)

(72) Inventors: Ganesh Hegde, Austin, TX (US); Mark Rodder, Dallas, TX (US); Jorge Kittl, Round Rock, TX (US); Chris Bowen, Austin, TX (US)

(73) Assignee: SAMSUNG ELECTRONICS CO., LTD. (KR)

( * ) Notice: Subject to any disclaimer, the term of this patent is extended or adjusted under 35 U.S.C. 154(b) by 348 days.

(21) Appl. No.: 14/931,845

(22) Filed: Nov. 3, 2015

(65) Prior Publication Data

US 2016/0148870 A1   May 26, 2016

Related U.S. Application Data

(60) Provisional application No. 62/082,516, filed on Nov. 20, 2014.

(51) Int. Cl.
*H01L 23/528* (2006.01)
*H01L 23/532* (2006.01)
*H01L 21/225* (2006.01)
*H01L 21/768* (2006.01)

(52) U.S. Cl.
CPC ...... *H01L 23/53238* (2013.01); *H01L 21/225* (2013.01); *H01L 21/76831* (2013.01); *H01L 21/76843* (2013.01); *H01L 21/76855* (2013.01); *H01L 23/53223* (2013.01); *H01L 23/53252* (2013.01); *H01L 23/53266* (2013.01); *H01L 2924/0002* (2013.01)

(58) Field of Classification Search
CPC ......... H01L 23/53238; H01L 21/76855; H01L 21/76831; H01L 23/53223; H01L 21/225; H01L 21/76843; H01L 23/53252; H01L 23/53266; H01L 2924/0002
USPC .......................................................... 257/774
See application file for complete search history.

(56) References Cited

U.S. PATENT DOCUMENTS

| | | |
|---|---|---|
| 6,309,982 B1 | 10/2001 | Chooi et al. |
| 8,232,611 B2 | 7/2012 | Miner et al. |
| 8,546,798 B2 | 10/2013 | Yang et al. |

(Continued)

*Primary Examiner* — Dzung Tran
(74) *Attorney, Agent, or Firm* — Renaissance IP Law Group LLP

(57) ABSTRACT

A diffusion barrier and a method to form the diffusion bather are disclosed. A trench structure is formed in an Inter Layer Dielectric (ILD). The ILD comprises a dielectric matrix having a first density. A dopant material layer is formed on the trench structure in which the dopant material layer comprises atoms of at least one of a rare-earth element. The ILD and the trench structure are annealed to form a dielectric matrix comprising a second density in one or more regions of the ILD on which the dopant material layer was formed that is greater than the first density. After annealing, the dielectric matrix comprising the second density includes increased bond lengths of oxygen-silicon bonds and/or oxygen-semiconductor bonds, increased bond angles of oxygen-silicon bonds and/or oxygen-semiconductor material bonds, and pores in the dielectric matrix are sealed compared to the dielectric matrix comprising the first density.

9 Claims, 3 Drawing Sheets

(56) References Cited

U.S. PATENT DOCUMENTS

2013/0330903 A1\* 12/2013 Malhotra .............. H01L 28/56
438/396
2016/0027664 A1\* 1/2016 Ando .............. H01L 21/32133
438/591

\* cited by examiner

LOW-K DIELECTRIC PORE SEALANT AND METAL-DIFFUSION BARRIER FORMED BY DOPING AND METHOD FOR FORMING THE SAME

CROSS-REFERENCE TO RELATED APPLICATION

This application claims priority under 35 U.S.C. § 120 to U.S. Provisional Patent Application Ser. No. 62/082,516 filed on Nov. 20, 2014, the contents of which are incorporated by reference in their entirety herein.

BACKGROUND

Damascene copper (Cu) metallization is the current interconnect metallization of choice for 20, 14 and 10 nm technology nodes and is likely to be method of choice for future 7, 5 and 3 nm nodes as well because copper has a lower resistivity in comparison to other low-cost alternative materials, such as aluminum (Al). A copper damascene process relies on a diffusion barrier to prevent copper from diffusing into an Inter Layer Dielectric (ILD). The diffusion barrier is commonly formed from tantalum nitride (TaN) or titanium nitride (TiN). Copper cannot diffuse through the barrier, and the metals forming the barrier do not diffuse into the ILD. While diffusion barriers formed by deposition are successful in keeping copper from diffusing into an ILD, the diffusion barriers also reduce the amount of copper that would be present in the cross section of an interconnect line or a via if no barrier was present.

Additionally, a metal liner is used to promote adhesion between copper and the diffusion barrier. Accordingly, to prevent copper diffusion into an ILD and to promote copper adhesion, diffusion barriers and metal liners must have a minimum thickness, which causes a further net reduction in copper cross-sectional area and an increase in the overall resistivity of interconnect lines and vias.

As interconnect pitch scales smaller, the copper cross-sectional area of an interconnect line further decreases and reduces overall line width. The metal half-pitch requirements are often met by scaling the amount of copper present along the width of an interconnect at a first scaling rate while the barrier plus liner width is scaled at a second, lesser scaling rate, which further results in a net reduction in copper cross-sectional area.

SUMMARY

Exemplary embodiments disclosed herein provide a method to form a diffusion barrier comprising: forming at least one trench structure or at least one via structure in an Inter Layer Dielectric (ILD) material, the ILD material comprising a dielectric matrix having a first density; forming a dopant material layer on the at least one trench structure or the at least one via structure, the dopant material layer comprising atoms of at least one of a rare-earth element; and annealing the dopant material layer and the at least one trench structure or the at least one via structure to form a dielectric matrix comprising a second density in one or more regions of the ILD on which the dopant material layer was formed in which the second density is greater than the first density. The second density in the one or more regions of the ILD on which the dopant material layer was formed may be the result of forming the dopant layer and annealing the dopant layer and the at least one trench structure or the at least one via structure, and not an intrinsic property of the ILD.

Exemplary embodiments disclosed herein provide an interconnect structure, comprising an Inter Layer Dielectric (ILD) material and a conductive materials. The ILD material comprising a trench structure or a via structure in which the trench structure comprises at least one sidewall and a bottom, and the via structure comprises at least one sidewall. The ILD material further comprises a dielectric matrix having a first density and a second density. The dielectric matrix having the first density is located in one or more regions of the ILD proximate to the at least one sidewall and the bottom of the trench structure or proximate to the at least one sidewall of the via structure. The dielectric matrix having the second density is located distal to the one or more regions of the ILD proximate to the at least one sidewall and the bottom of the trench structure or proximate to the at least one sidewall of the via structure, and contains atoms of at least one rare earth element. The first density is greater than the second density. The dielectric structure having the first density that is greater than the second density may be the result of forming the dopant layer and annealing the dopant layer and the at least one trench structure or the at least one via structure, and may not be an intrinsic property of the ILD. The conductive material is disposed in the at least one trench structure or in the at least one via structure.

Exemplary embodiments disclosed herein provide a semiconductor device, comprising an Inter Layer Dielectric (ILD) material and a conductive material. The ILD material comprises a trench structure or a via structure in which the trench structure comprises at least one sidewall and a bottom, and the via structure comprises at least one sidewall. The ILD material further comprises a dielectric matrix having first and second regions. The second region is proximate to the at least one sidewall and the bottom of the trench structure or proximate to the at least one sidewall of the via structure and in which a second region is located between a first region and the one or more regions of the ILD proximate to the at least one sidewall and the bottom of the trench structure or proximate to the at least one sidewall of the via structure. The second region of the dielectric matrix further comprises a dopant material comprising atoms of at least one of a rare-earth element. The conductive material is disposed in the at least one trench structure or in the at least one via structure.

BRIEF DESCRIPTION OF THE DRAWINGS

Example embodiments will be more clearly understood from the following detailed description taken in conjunction with the accompanying drawings. The Figures represent non-limiting, example embodiments as described herein.

DESCRIPTION OF EMBODIMENTS

Figure 1:
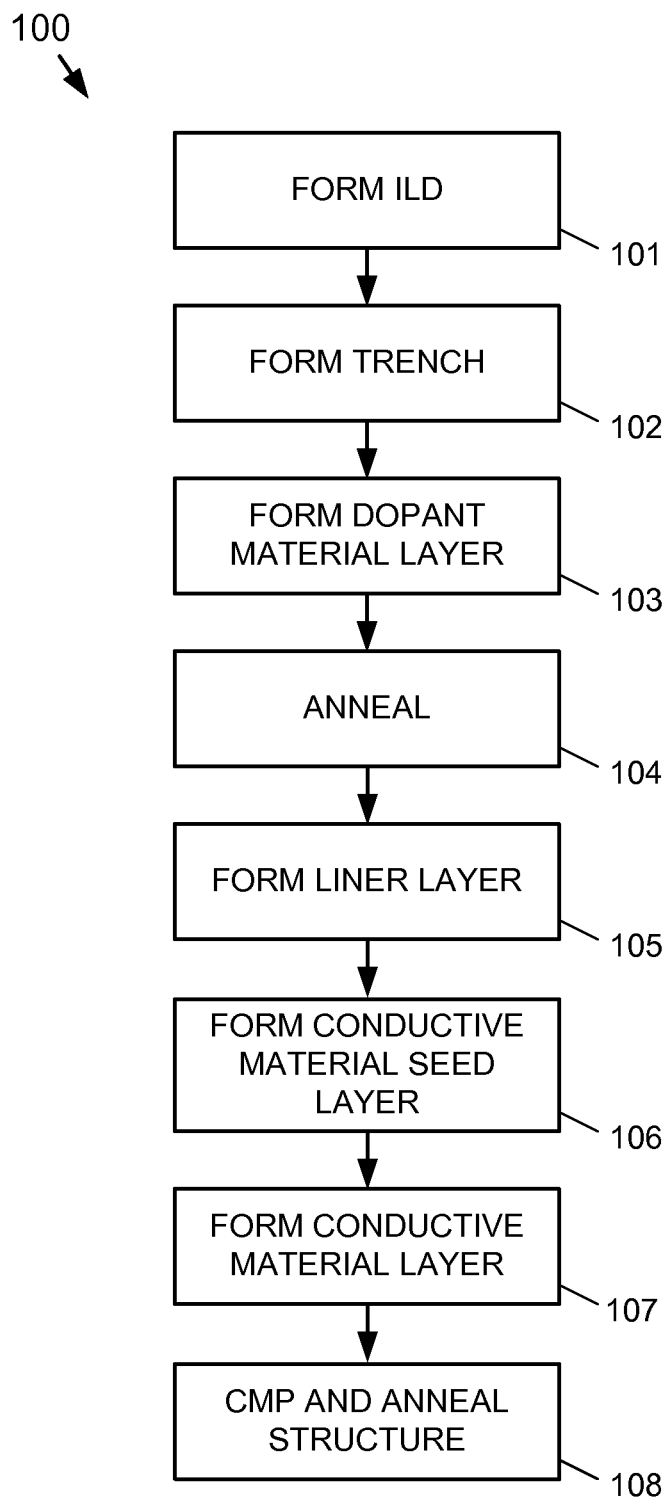
FIG. 1 depicts a flow diagram of a first exemplary embodiment of a process to form a low-k dielectric pore sealant and metal-diffusion barrier for damascene metallization according to the subject matter disclosed herein.

The subject matter disclosed herein relates to a device and a method to make the device that utilize a low-k dielectric pore sealant and metal-diffusion barrier formed in a dielectric matrix for damascene metallization.

Various exemplary embodiments will be described more fully hereinafter with reference to the accompanying drawings, in which some exemplary embodiments are shown. As used herein, the word "exemplary" means "serving as an example, instance, or illustration." Any embodiment described herein as "exemplary" is not to be construed as necessarily preferred or advantageous over other embodiments. The subject matter disclosed herein may, however, be embodied in many different forms and should not be construed as limited to the exemplary embodiments set forth herein. Rather, the exemplary embodiments are provided so that this description will be thorough and complete, and will fully convey the scope of the claimed subject matter to those skilled in the art. In the drawings, the sizes and relative sizes of layers and regions may be exaggerated for clarity.

It will be understood that when an element or layer is referred to as being on, "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limiting of the claimed subject matter. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of idealized exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but are to include deviations in shapes that result, for example, from manufacturing. For example, an implanted region illustrated as a rectangle may, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the claimed subject matter.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The subject matter disclosed herein relates to a method and a device that utilize a low-k dielectric pore sealant and metal-diffusion barrier formed in a dielectric matrix, such as an Inter Layer Dielectric (ILD), for damascene metallization. Embodiments disclosed herein provide a method to form a Rare Earth-doped (RE-doped) diffusion barrier that does not deposit a diffusion barrier in a metallization trench or a via so that the amount of conductive element in the cross section of the trench or via increases, and thereby reduces the RC delay associated with the metallization. That is, embodiments disclosed herein increase the copper volume in a metallization trench or in a via and reduce the resistance R of the metallization without requiring a High Aspect Ratio (HAR) trench or without increasing the width of the trench or via.

A damascene metallization formed according to the subject matter disclosed herein may reduce the Direct Current (DC) Resistance Capacitance (RC) delay by greater than 10% for interconnect lines and by greater than 20% for vias in comparison to a conventionally formed damascene metallization that uses deposited liners and non-self-formed barriers. In one exemplary embodiment, the embodiments disclosed provide about a 10% increase in the amount of conductive material in an interconnect or a via in comparison to a conventionally formed interconnect or a via for a given interconnect or a given via size.

Embodiments disclosed herein also provide a low-k dielectric pore sealant and a conductive-element diffusion barrier in a dielectric matrix, such as an ILD, by modifying the local topology of the dielectric matrix so that bonds are formed between the dopant atoms and oxygen in the dielectric matrix and the bond angles and bond lengths are increased between the elements originally present in the dielectric matrix, resulting in an overall densification of the matrix that stops diffusion of the conductive-element atoms.

Rare earth (RE) scandates ($REScO_3$) have been used as a conventionally formed diffusion barrier layer. While the k value for most rare earth scandates is high, the combined capacitance C of the diffusion barrier and the ILD only increases slightly if ultrathin layers of a rare earth scandate are used. Rare earth dopants have also been used for the stabilization of thermodynamic and electrical characteristics of high-k gate stacks by increasing RE-O bonding. The resultant gate stacks show improved Capacitance versus Voltage (CV) characteristics and significantly reduced damage from successive semiconductor processing steps. An important insight from atomistic first principles and experimental analysis of the gate-stack stabilization is that a significant change in the local topology of the environment is observed. That is, RE doping serves to alter the dielectric matrix so that oxide-semiconductor bond length increases, oxide-semiconductor bond angle increases, oxide-RE bonding increases, and an overall densification of the matrix is achieved.

FIG. 1 depicts a flow diagram of a first exemplary embodiment of a process 100 to form a low-k dielectric pore sealant and metal-diffusion barrier for damascene metallization according to the subject matter disclosed herein. FIGS. 2A-2H respectively depict cross-sectional views of a first exemplary embodiment of a device comprising a low-k dielectric pore sealant and metal-diffusion barrier for damascene metallization at various stages of process 100 (FIG. 1) according to the subject matter disclosed herein. Details of circuitry associated with structure depicted in FIGS. 2A-2H have been omitted for clarity. Although FIGS. 1 and 2A-2H relate to a low-k dielectric pore sealant and metal-diffusion barrier for a conductive interconnect, it should be understood that a similar alternative process may be used for forming a low-k dielectric pore sealant and metal-diffusion barrier for a conductive via.

At 101 in FIG. 1, a low-k Inter Layer Dielectric (ILD) 201 (FIG. 2A) is formed using a well-known deposition technique. In one exemplary embodiment, ILD 201 may be formed from a dielectric material that may comprise a well-known combination of silicon (Si), carbon (C), nitrogen (N), hydrogen (H), and/or oxygen (O). ILD 201 may also make use of porosity to lower the k value of the ILD dielectric.

At 102, a trench 202 (FIG. 2B) for a conductive interconnect is formed in ILD 201 using a well-known etching technique. The cross-sectional size of the trench 202 depends on the type of structure being formed by the trench 202, i.e., whether the trench 202 is an interconnect line or a via, and the node, i.e., 7, 5, 3 or 2 nm. In one exemplary embodiment in which trench 202 comprises an interconnect line, the cross-sectional size of the trench 202 ranges from about 4 $nm^2$ to about 50 $nm^2$.

At 103, a dopant material layer 203 (FIG. 2C) is formed on the dielectric matrix of the ILD 201 using a well-known techniques, such as, but not limited to, Pulsed Laser Ablation Deposition (PLAD) or Atomic Layer Deposition (ALD). In one exemplary embodiment, the thickness of the dopant material layer 203 is selected so that after annealing operation 104, a diffusion barrier 204 is formed in the ILD 201 that is between about 0.5 nm thick and about 3 nm thick. In one exemplary embodiment, the dopant material layer 203 may comprise rare-earth atoms. In one exemplary embodiment, the dopant material layer 203 may comprise atoms or a combination of atoms selected from the group comprising yttrium (Y), lanthanum (La), scandium (Sc), holmium (Ho), dysprosium (Dy), praseodymium (Pr), cerium (Ce), promethium (Pm), samarium (Sm), europium (Eu), gadolinium (Gd), terbium (Tb), erbium (Er), thulium (Tm), ytterbium (Yb), lutetium (Lu), and neodymium (Nd).

In an alternative exemplary embodiment, prior to forming the dopant material layer 203 at 103, a monolayer of a dielectric material that is different from the dielectric material forming the ILD 201 may be formed to enhance the bonding of atoms of the dopant material layer 203 to a dielectric matrix that will be formed during annealing. In one exemplary embodiment, the range of thicknesses of the monolayer of the dielectric material that is different from the dielectric material forming the ILD is between about 0.5 nm to about 3 nm, and so that the thickness of the barrier layer 204 that is formed after the annealing operation 104 ranges from about 0.5 nm thick and about 3 nm thick.

In another alternative exemplary embodiment, a monolayer of dopant material layer 203 along with a semiconductor material, such as silicon (Si) and oxygen (O), may be deposited using a well-known technique, such as an atomic layer deposition (ALD) technique. In one exemplary embodiment, the range of thicknesses of the monolayer of the dopant material layer 203 along with the semiconductor material is between about 0.5 nm to about 3 nm, and so that the thickness of the barrier layer 204 that is formed after the annealing operation 104 ranges from about 0.5 nm thick and about 3 nm thick.

At 104, the structure formed by the ILD 201 and the dopant material layer 203 is annealed in a well-known manner. In one exemplary embodiment, the annealing time may range from about 30 seconds to about 16 hours, and the annealing temperature may range from about 50 C to about 650 C. In another exemplary embodiment, the annealing time may range from about 30 minutes to about eight hours, and the annealing temperature range may range from about 350 C and about 650 C. In yet another exemplary embodiment, the annealing temperature may range up to about 1500 C. In yet another exemplary embodiment, the annealing time may be as short as about a few seconds.

During annealing, the atoms of the dopant material layer 203 diffuse a few monolayers into the ILD 201 and bond with the oxygen atoms and semiconductor species atoms of the ILD 201 to form a diffusion barrier 204 (FIG. 2D) comprising a dielectric matrix having a density that is greater than the original density of the dielectric matrix. In one exemplary embodiment, the diffusion barrier layer 204 may be formed within the ILD 201. In one exemplary embodiment, the diffusion barrier 204 that comprises a dielectric matrix having a density that is greater than the original density of the dielectric matrix may be the result of forming the dopant layer 203 and annealing the structure formed by the ILD 201 and the dopant material layer 203, and not an intrinsic property of the ILD 201. In one exemplary embodiment, the local topology of the dielectric matrix of the diffusion barrier comprises a dielectric matrix in which (1) the number of bonds between the atoms of the dopant material layer 203 and oxygen (O) is increased; (2) the bond lengths of the oxygen-silicon (O—Si) bonds and/or the oxygen-semiconductor (O-semiconductor) bonds are increased; (3) the bond angles of the O—Si bonds and/or the O-semiconductor bonds are increased; (4) a density of the dielectric matrix increases and pores (e.g., air pores) are sealed in regions in which the atoms of the dopant material layer 203 are present; and/or (5) atoms of a conductive material used later for damascene metallization cannot diffuse through the dielectric matrix.

In one exemplary embodiment, the diffusion barrier 204 has a thickness of between about 0.5 nm to about 20 nm, and has a dielectric constant k between about 2.5 and about 50. In another exemplary embodiment, the diffusion barrier 204 has a thickness of about 0.5 nm to about 2 nm, and a dielectric constant k of about 10 to about 50. In one exemplary embodiment, the size of the trench 202 remains nominally the same because the dopant atoms are internalized into the ILD 201. There may be, however, exemplary embodiment in which one or more monolayers of an oxide are deposited to assist formation of the dense doped barrier, in which case size of the trench 202 may be reduced.

At 105, a liner layer 205 (FIG. 2E) is formed on the diffusion barrier 204. In one exemplary embodiment, liner layer 205 is formed to have a thickness of about 0.2 nm to about 3 nm. In one exemplary embodiment, the liner layer comprises one or more elements or materials selected from the group comprising tantalum nitride (TaN), titanium nitride (TiN), cobalt (Co), ruthenium (Ru), tungsten (W), titanium (Ti), manganese (Mn), chromium (Cr), vanadium (V), TiSi, silver (Ag), and tantalum (Ta).

In one exemplary embodiment, the liner layer 205 may formed using a well-known isotropic deposition technique and a well-known directional etch so that one element or material selected from the elements and materials forming liner layer 205 is formed on a sidewall of the trench 202/diffusion barrier 204 structure, and another element or material selected from the materials forming liner 205 is formed on a bottom of the trench 202/diffusion barrier 204 structure. In one exemplary embodiment, the liner layer 205 may be formed using known techniques, such as a conformal deposition of a first material followed by anisotropic etch that leaves the first material mainly on sidewalls of the trench 202/diffusion barrier 204 structure. Afterward, a directional deposition of a second material is used so that the second material is mainly formed at bottom of the trench 202/diffusion barrier 204 structure. The second material is then removed removal from the sidewalls of the trench 202/diffusion barrier 204 structure by isotropic etch. A film of the second material may be left on the sidewalls that is much thinner than the second material that is left on the bottom of the trench 202/diffusion barrier 204 structure.

In another exemplary embodiment, a well-known directional deposition technique is used to form two liner layers 205 (not shown) so that the thickness of first liner layer is thicker than the thickness of the second liner layer on the sidewalls, and the thickness of the first liner layer is thinner than the thickness of the second liner layer on the bottom of trench 402 so that the conductive material deposited later in process 100 wets significantly more on the bottom of trench 202 than on the sidewalls of trench 202. In yet another exemplary embodiment, a well-known directional deposition technique is used to form the thickness of first liner layer to be thinner than the thickness of the second liner layer on the side walls, and the thickness of the first liner layer is thicker than the thickness of the second liner layer on the bottom of trench 202 so that the conductive material deposited later in process 100 wets significantly more on the sidewalls of trench 202 than on the bottom of trench 202. In one exemplary embodiment, a combination of directional depositions and anisotropic etches can be used in which the directional depositions form thicker layers at the bottom of the trench 202/diffusion barrier 204 structure, and the anisotropic etches etch mainly the layer at the bottom of the trench 202/diffusion barrier 204 structure leaving thicker layers at the sidewalls.

Figure 2A:
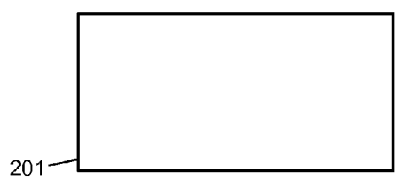
FIGS. 2A-2H respectively depict cross-sectional views of a first exemplary embodiment of a device comprising a low-k dielectric pore sealant and metal-diffusion barrier for damascene metallization at various stages of process (FIG. 1) according to the subject matter disclosed herein.
Figure 2B:
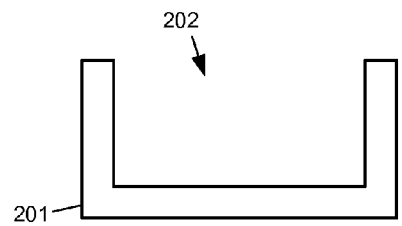
Figure 2C:
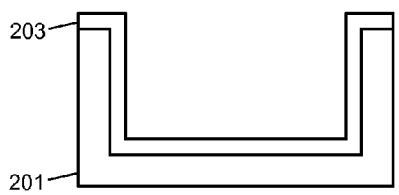
Figure 2D:
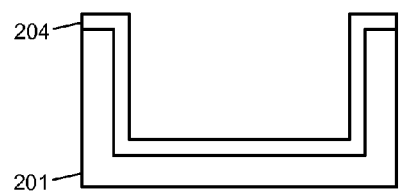
Figure 2E:
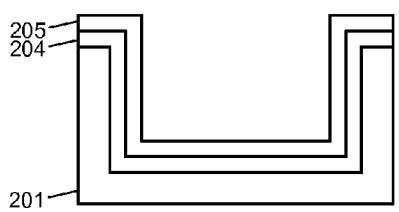
Figure 2F:
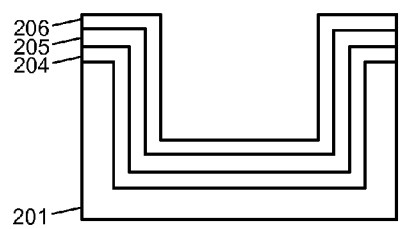

At 106, a conductive material seed layer 206 is formed on the liner layer 205 using a well-known conformal deposition technique (FIG. 2F). In one exemplary, conductive material seed layer 206 comprises one or more elements or materials selected from the group comprising copper (Cu), aluminum (Al), silver (Ag), gold (Au), titanium (Ti), tantalum (Ta), cobalt (Co), tungsten (W), ruthenium (Ru), nickel (Ni), chromium (Cr) and molybdenum (Mo). In an alternative exemplary embodiment, operation 105 may be omitted and the conductive materials seed layer 206 may be formed directly on diffusion barrier 204. In one exemplary embodiment, the thickness of the conductive material seed layer 206 ranges from about 1 nm to about 3 nm.

Figure 2G:
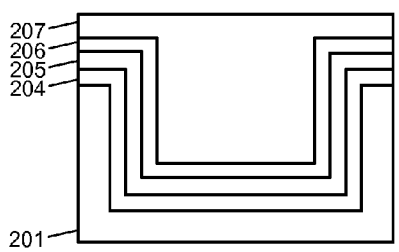

At 107, a conductive material layer 207 is formed on the conductive materials seed layer 206 using a well-known electro-deposition technique (FIG. 2G). In one exemplary, conductive material layer 207 comprises one or more elements or materials selected from the group comprising copper (Cu), aluminum (Al), silver (Ag), gold (Au), titanium (Ti), tantalum (Ta), cobalt (Co), tungsten (W), ruthenium (Ru), nickel (Ni), chromium (Cr) and molybdenum (Mo).

Figure 2H:
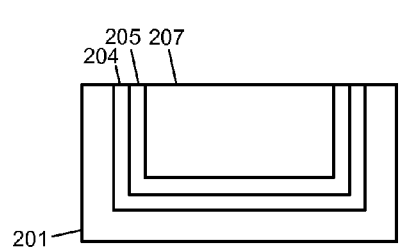

At 108, a well-known CMP technique is used to form the final interconnect structure (FIG. 2H). Further processing can be performed at this point, such as, but not limited to, capping of the structure so formed with additional layers of ILD that may or may not have the same k as the ILD 201.

One alternative exemplary embodiment provides that operation 103 of process 100 is replaced by deposition of an ALD oxide of the atoms selected to form the dopant material layer 203. For example, if a rare earth component Y is selected to be used as a dopant material SiYO (or another alternate stoichiometry of these atoms) would be deposited using ALD to form the barrier. In one exemplary embodiment, the Y of ALD oxide may comprise rare-earth atoms. In another exemplary embodiment, the Y of the ALD oxide may comprise atoms or a combination of atoms selected from the group comprising yttrium (Y), lanthanum (La), scandium (Sc), holmium (Ho), dysprosium (Dy), praseodymium (Pr), cerium (Ce), promethium (Pm), samarium (Sm), europium (Eu), gadolinium (Gd), terbium (Tb), erbium (Er), thulium (Tm), ytterbium (Yb), lutetium (Lu), and neodymium (Nd).

Another alternative exemplary embodiment provides that trench 202 is formed to be relatively deeper and wider in comparison to the first exemplary embodiment (FIGS. 2A-2H) so that a thicker layer of dopant material layer 203 can be deposited on trench structure 202. In one exemplary embodiment, the thickness of the thicker layer of deposited dopant material layer 203 is selected to be about 1 nm thicker than the thickness selected at operation 103. After a diffusion barrier 204 has been, the non-conductive area of the conductive interconnect (or via) is about the same size.

Figure 3:
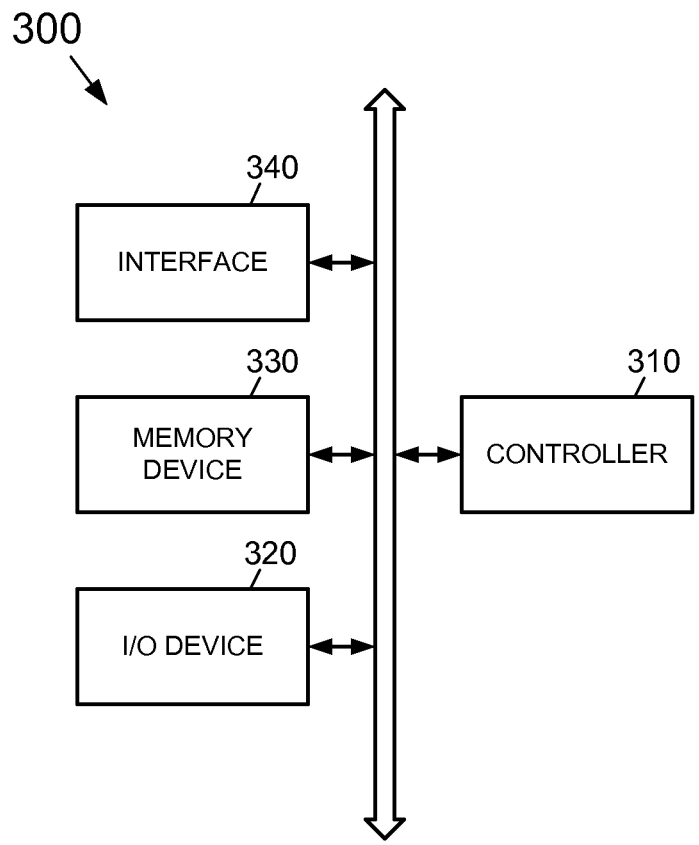
FIG. 3 depicts an electronic device that comprises one or more integrated circuits (chips) comprising one or more interconnects and/or vias that utilize a low-k dielectric pore sealant and metal-diffusion barrier formed in a dielectric matrix for damascene metallization according to exemplary embodiments disclosed herein.

FIG. 3 depicts an electronic device 300 that comprises one or more integrated circuits (chips) comprising one or more interconnects and/or vias that utilize a low-k dielectric pore sealant and metal-diffusion barrier formed in a dielectric matrix for damascene metallization according to exemplary embodiments disclosed herein. Electronic device 300 may be used in, but not limited to, a computing device, a personal digital assistant (PDA), a laptop computer, a mobile computer, a web tablet, a wireless phone, a cell phone, a smart phone, a digital music player, or a wireline or wireless electronic device. The electronic device 300 may comprise a controller 310, an input/output device 320 such as, but not limited to, a keypad, a keyboard, a display, or a touch-screen display, a memory 330, and a wireless interface 340 that are coupled to each other through a bus 350. The controller 310 may comprise, for example, at least one microprocessor, at least one digital signal process, at least one microcontroller, or the like. The memory 330 may be configured to store a command code to be used by the controller 310 or a user data. Electronic device 300 and the various system components comprising electronic device 300 may comprise one or more integrated circuits (chips) comprising one or more interconnects and/or vias that utilize a low-k dielectric pore sealant and metal-diffusion barrier formed in a dielectric matrix for damascene metallization according to exemplary embodiments disclosed herein. The electronic device 300 may use a wireless interface 340 configured to transmit data to or receive data from a wireless communication network using a RF signal. The wireless interface 340 may include, for example, an antenna, a wireless transceiver and so on. The electronic system 300 may be used in a communication interface protocol of a communication system, such as, but not limited to, Code Division Multiple Access (CDMA), Global System for Mobile Communications (GSM), North American Digital Communications (NADC), Extended Time Division Multiple Access (E-TDMA), Wideband CDMA (WCDMA), CDMA2000, Wi-Fi, Municipal Wi-Fi (Muni Wi-Fi), Bluetooth, Digital Enhanced Cordless Telecommunications (DECT), Wireless Universal Serial Bus (Wireless USB), Fast low-latency access with seamless handoff Orthogonal Frequency Division Multiplexing (Flash-OFDM), IEEE 802.20, General Packet Radio Service (GPRS), iBurst, Wireless Broadband (WiBro), WiMAX, WiMAX-Advanced, Universal Mobile Telecommunication Service-Time Division Duplex (UMTS-TDD), High Speed Packet Access (HSPA), Evolution Data Optimized (EVDO), Long Term Evolution-Advanced (LTE-Advanced), Multi-channel Multipoint Distribution Service (MMDS), and so forth.

Figure 4:
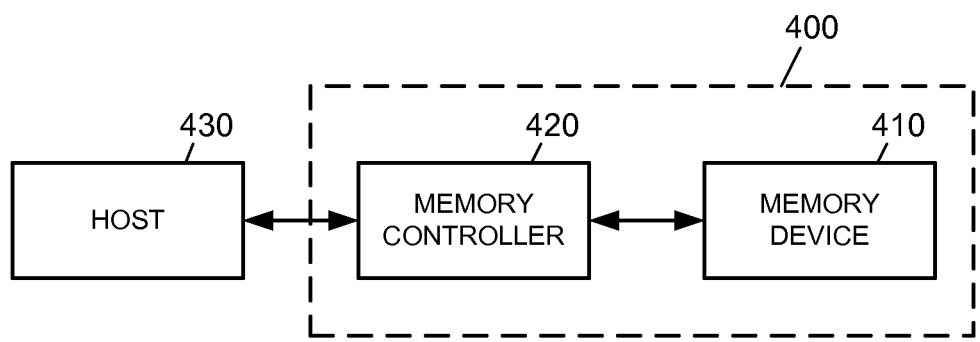
FIG. 4 depicts a memory system that may comprise one or more integrated circuits (chips) comprising one or more interconnects and/or vias that utilize a low-k dielectric pore sealant and metal-diffusion barrier for damascene metallization formed in a dielectric matrix according to example embodiments disclosed herein.

FIG. 4 depicts a memory system 400 that may comprise one or more integrated circuits (chips) comprising one or more interconnects and/or vias that utilize a low-k dielectric pore sealant and metal-diffusion barrier formed in a dielectric matrix for damascene metallization according to example embodiments disclosed herein. The memory system 400 may comprise a memory device 410 for storing large amounts of data and a memory controller 420. The memory controller 420 controls the memory device 410 to read data stored in the memory device 410 or to write data into the memory device 410 in response to a read/write request of a host 430. The memory controller 420 may include an address-mapping table for mapping an address provided from the host 430 (e.g., a mobile device or a computer system) into a physical address of the memory device 410. The memory device 410 may comprise one or more semiconductor devices comprising one or more interconnects and/or vias that utilize a low-k dielectric pore sealant and metal-diffusion barrier formed in a dielectric matrix for damascene metallization according to exemplary embodiments disclosed herein.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the subject matter disclosed herein. Accordingly, all such modifications are intended to be included within the scope of the appended claims.

What is claimed is:

1. A semiconductor device, comprising:
a low-k Inter Layer Dielectric (ILD) material comprising a trench structure or a via structure, the trench structure comprising at least one sidewall and a bottom and the via structure comprising at least one sidewall, the low-k ILD material comprising a low-k dielectric matrix having a first region with a first density and a second region with a second density, the first region of the low-k dielectric matrix having the first density being located in one or more regions of the low-k ILD material proximate to the at least one sidewall and the bottom of the trench structure or proximate to the at least one sidewall of the via structure, the second region of the low-k dielectric matrix having the second density being located distal to the one or more regions of the low-k ILD material proximate to the at least one sidewall and the bottom of the trench structure or proximate to the at least one sidewall of the via structure, the first density being greater than the second density, and the low-k dielectric matrix having the second density comprising a dielectric constant that is between 2.5 and 3.7; and
a conductive material disposed in the at least one trench structure or in the at least one via structure,
wherein the first region of the low-k dielectric matrix is interposed between the conductive material and the second region of the low-k dielectric matrix, and
wherein pores in the low-k dielectric matrix comprising the first density are at least partially sealed in comparison to pores in the low-k dielectric matrix comprising the second density.

2. The semiconductor device according to claim 1, wherein the low-k dielectric matrix comprising the first density comprises a dopant material comprising atoms of at least one of a rare-earth element.

3. The semiconductor device according to claim 2, wherein the low-k ILD further comprises oxygen, and wherein the low-k dielectric matrix comprising the first density further comprises an increased number of bonds between the atoms of the dopant material and oxygen in the low-k ILD.

4. The semiconductor device according to claim 2, wherein the low-k ILD further comprises at least one of silicon, oxygen and a semiconductor material, and wherein the low-k dielectric matrix comprising the first density comprises increased bond lengths of oxygen-silicon bonds and/or oxygen-semiconductor bonds compared to bond lengths of oxygen-silicon bonds and/or oxygen-semiconductor bonds in the low-k dielectric matrix comprising the second density.

5. The semiconductor device according to claim 2, wherein the low-k ILD further comprises at least one of silicon, oxygen and a semiconductor material, and wherein the low-k dielectric matrix comprising the first density comprises increased bond angles of oxygen-silicon bonds and/or oxygen-semiconductor material bonds compared to bond angles of oxygen-silicon bonds and/or oxygen-semiconductor material bonds in the low-k dielectric matrix comprising the second density.

6. A semiconductor device, comprising:

a low-k Inter Layer Dielectric (ILD) material comprising a trench structure or a via structure, the trench structure comprising at least one sidewall and a bottom and the via structure comprising at least one sidewall, the low-k ILD material comprising a low-k dielectric matrix having a first region and a low-k dielectric pore sealant and metal-diffusion barrier, the low-k dielectric pore sealant and metal-diffusion barrier being proximate to the at least one sidewall and the bottom of the trench structure or being proximate to the at least one sidewall of the via structure, the low-k dielectric pore sealant and metal-diffusion barrier of the low-k dielectric matrix comprising a dopant material comprising atoms of at least one of holmium (Ho), dysprosium (Dy), praseodymium (Pr), cerium (Ce), promethium (Pm), samarium (Sm), europium (Eu), gadolinium (Gd), terbium (Tb), erbium (Er), thulium (Tm), ytterbium (Yb), lutetium (Lu), and neodymium (Nd); and a conductive material disposed in the at least one trench structure or in the at least one via structure, wherein the low-k dielectric pore sealant and metal-diffusion barrier of the low-k dielectric matrix is interposed between the first region of the low-k dielectric matrix and the conductive material, wherein the low-k dielectric pore sealant and metal-diffusion barrier of the low-k dielectric matrix comprises a first density, wherein the first region of the low-k dielectric matrix comprises a second density, the first density being greater than the second density, wherein pores of the low-k dielectric pore sealant and metal-diffusion barrier are at least partially sealed in comparison to pores in the low-k dielectric matrix comprising the second density, and wherein the first region of the low-k dielectric matrix comprises a dielectric constant that is between 2.5 and 3.7.

7. The semiconductor device according to claim 6, wherein the low-k ILD further comprises oxygen, and wherein the low-k dielectric matrix comprising the first density further comprises an increased number of bonds between the atoms of the dopant material and oxygen in the low-k ILD compared a number of bonds between atoms of the dopant material and oxygen in the low-k dielectric matrix comprising the second density.

8. The semiconductor device according to claim 6, wherein the low-k ILD further comprises at least one of silicon, oxygen and a semiconductor material, and wherein the low-k dielectric matrix comprising the first density comprises increased bond lengths of oxygen-silicon bonds and/or oxygen-semiconductor bonds compared to bond lengths of oxygen-silicon bonds and/or oxygen-semiconductor bonds in the low-k dielectric matrix comprising the second density.

9. The semiconductor device according to claim 6, wherein the low-k ILD further comprises at least one of silicon, oxygen and a semiconductor material, and wherein the low-k dielectric matrix comprising the first density comprises increased bond angles of oxygen-silicon bonds and/or oxygen-semiconductor material bonds compared to bond angles of oxygen-silicon bonds and/or oxygen-semiconductor material bonds in the low-k dielectric matrix comprising the second density.

\* \* \* \* \*